(12) United States Patent  
Wu

(10) Patent No.: US 6,722,897 B1
(45) Date of Patent: Apr. 20, 2004

(54) ADAPTER FOR POWER CONNECTORS

(75) Inventor: Jerry Wu, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/271,288

(22) Filed: Oct. 15, 2002

(51) Int. Cl.[7] .................................................. H01R 9/09
(52) U.S. Cl. ....................................................... 439/76.1
(58) Field of Search ................................ 439/76.1, 638

(56) References Cited

U.S. PATENT DOCUMENTS

| | | | |
|---|---|---|---|
| 6,338,655 B1 * | 1/2002 | Masse et al. | 439/638 |
| 6,447,339 B1 * | 9/2002 | Reed et al. | 439/638 |
| 6,527,564 B1 * | 3/2003 | Yeh | 439/76.1 |
| 6,623,306 B2 * | 9/2003 | Xu et al. | 439/676 |

* cited by examiner

*Primary Examiner*—Javaid H. Nasri
*Assistant Examiner*—Thanh-Tam Le
(74) *Attorney, Agent, or Firm*—Wei Te Chung

(57) ABSTRACT

A power adapter (100) for use with power connectors includes a printed circuit board (3), first and second connectors (1, 2) attached on opposite surfaces of the printed circuit board. The first electrical connector is configured with a Serial Advanced Technology Attachment (SATA) interface and has a number of first terminals (11) conductively received in first through-holes (31) of the printed circuit board. The second electrical connector is configured as a conventional power connector and has a number of second terminals (21) conductively received in second through-holes (30) of the printed circuit board. The power trace is transmitted from the first connector to the second connector via the printed circuit board, in which circuits are defined between predetermined first through-holes and the second through-holes.

1 Claim, 6 Drawing Sheets

ADAPTER FOR POWER CONNECTORS

CROSS-REFERENCE TO RELATED APPLICATIONS

This patent application is related to U.S. patent application Ser. No. 10/211,464, entitled "ELECTRICAL ADAPTER", filed on Aug. 1, 2002; and is a co-pending application of U.S. Patent Application with an unknown serial number, entitled "POWER ADAPTER FOR INTERCONNECTING DIFFERENT TYPES OF POWER CONNECTORS"; and another application with an unknown serial number entitled "ELECTRICAL ADAPTER" all assigned to the same assignee.

BACKGROUND OF THE INVENTION

1. Field of the Invention

The present invention generally relates to an electrical adapter, and particularly to an electrical adapter for joining two power connectors having different designs and configurations.

2. Description of Prior Arts

The design of a mother printed circuit board is repeatedly upgraded for complying with an issuance of each new electrical member to be mounted thereon. Some peripheral electrical devices such as a power supply and the related power connector must also be adapted to accommodate the new type of printed circuit board. Therefore, various interface standard power connectors are continually proposed to be applied in a computer interior structure. However, such power connectors according different interface standards are generally featured in different configurations and each has different numbers electrical contacts therein. Understandably, such different interface standard power connectors cannot mate directly. Many electrical adapters, thereby, are designed to interconnect those different interface standard connectors.

There exists in the art an electrical connector known as a Serial Advanced Technology Attachment (Serial ATA) connector which is generally used for disk drives and storage peripherals connecting with the mother printed circuit board. It should be noted that the Serial ATA power connectors according the Serial ATA standard are in added power contacts than other conventional power connectors used in Integrated Drive Electronics (IDE) and are relatively different in configurations. Correspondingly, the present problem people in the art confronts, is that a storage peripheral using a Serial ATA power connector may be required to connect with an existing mother printed circuit board which originally uses a conventional IDE power connector to connect with the storage peripheral. Obviously, it is not convenient to wholly replace the system, which adds cost. Accordingly, a power adapter interconnecting the Serial ATA power connector and the conventional IDE power connector is desired.

Hence, a power adapter for interconnecting the Serial ATA power connector and the conventional IDE power connector is highly desired.

BRIEF SUMMARY OF THE INVENTION

Accordingly, an object of the present invention is to provide a power adapter for electrically interconnecting a Serial ATA power connector and a conventional IDE power connector.

In order to achieve the above-mentioned object, a power adapter in accordance with the present invention includes a printed circuit board, first and second connectors attached on opposite surfaces of the printed circuit board. The first electrical connector is configured with a Serial Advanced Technology Attachment (SATA) interface and has a number of first terminals conductively received in first through-holes of the printed circuit board. The second electrical connector is configured as a conventional power connector and has a number of second terminals conductively received in second through-holes of the printed circuit board. The power trace is transmitted from the first connector to the second connector via the printed circuit board, in which circuits are defined between predetermined first through-holes and the second through-holes.

Other objects, advantages and novel features of the invention will become more apparent from the following detailed description of the present embodiment when taken in conjunction with the accompanying drawings.

DETAILED DESCRIPTION OF THE INVENTION

Figure 1:
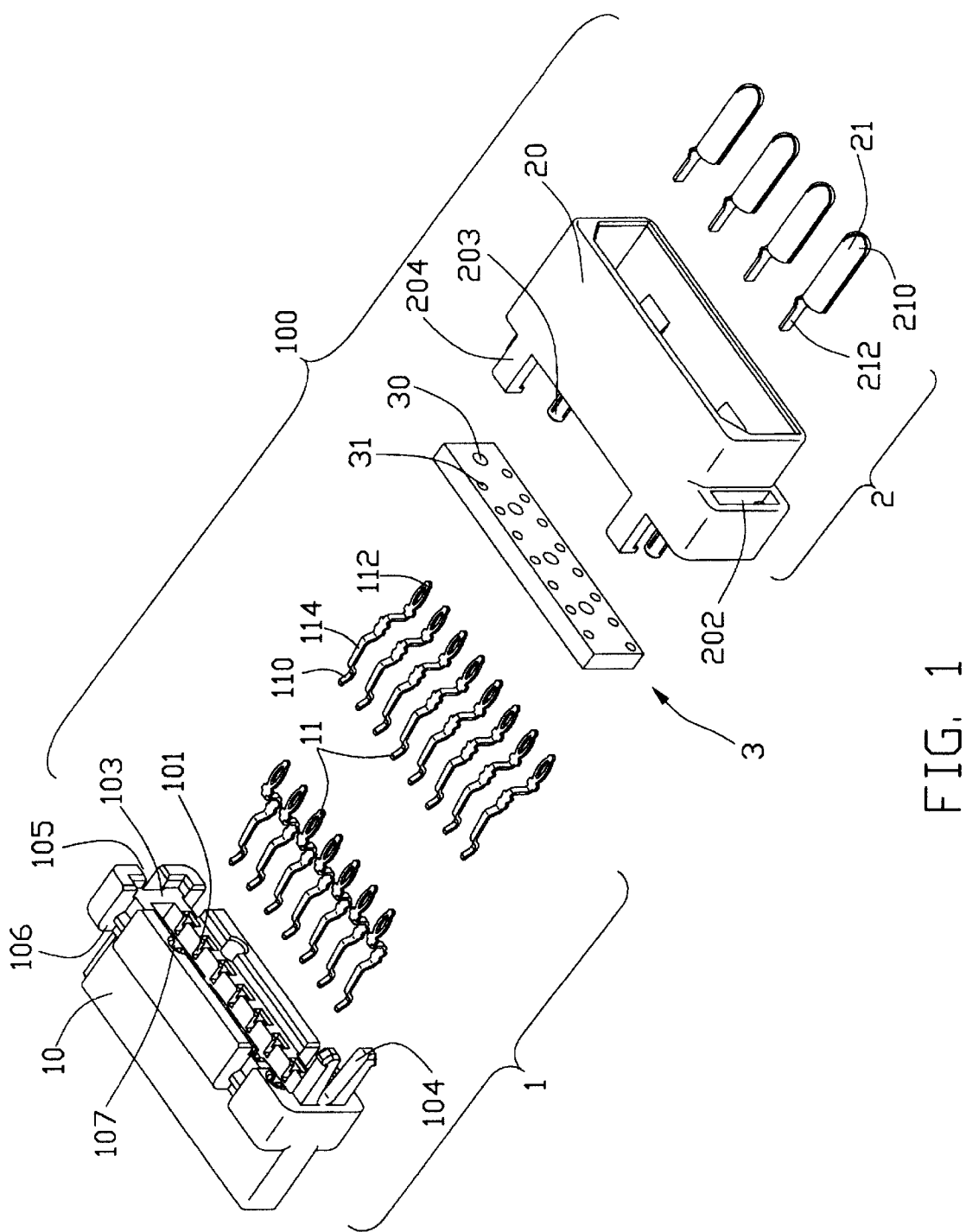
FIG. 1 is an exploded, perspective view of an adapter in accordance with the present invention.

Reference will now be made to the drawing figures to describe the present invention in detail.

Figure 2:
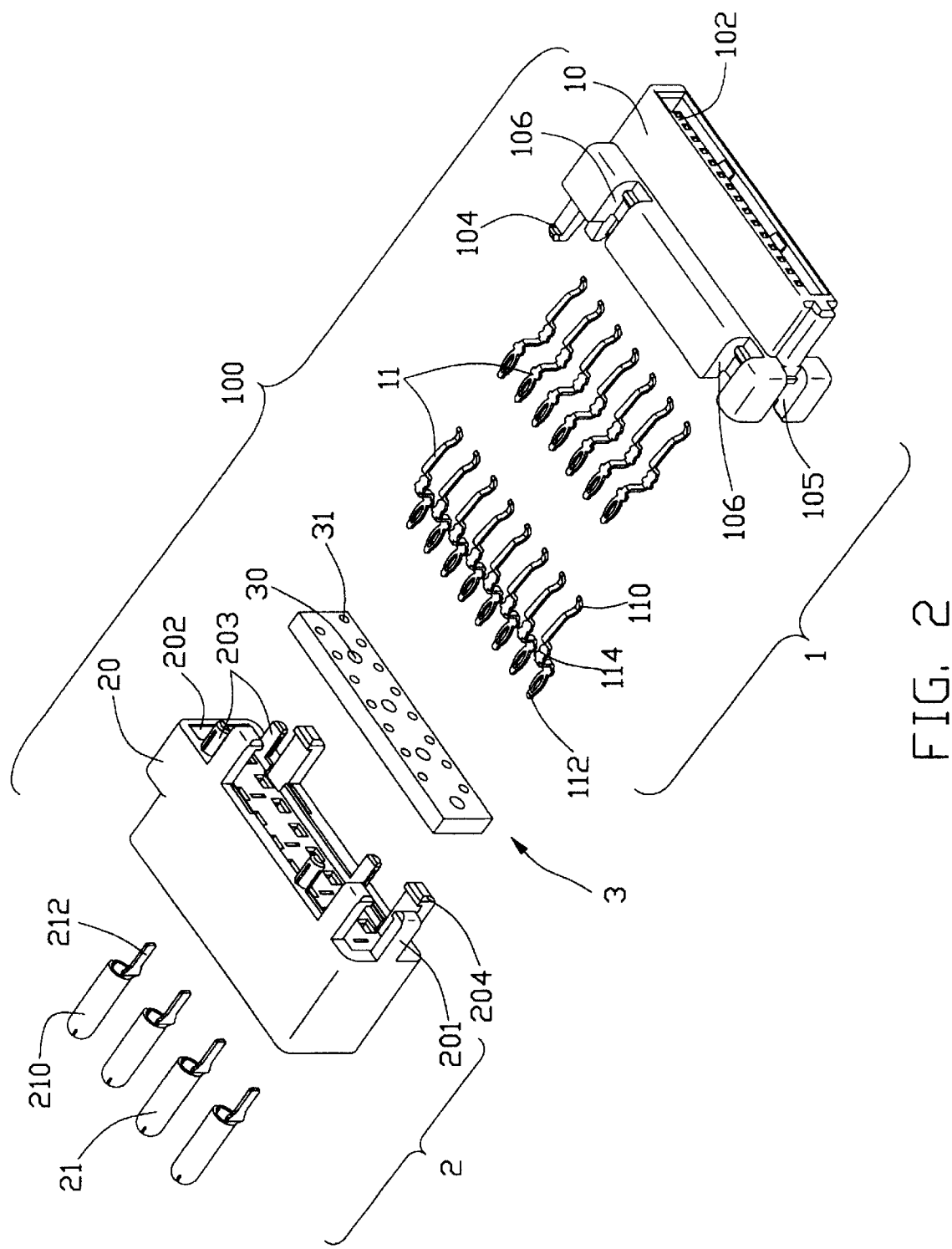
FIG. 2 is a view similar to FIG. 1 while taken from another aspect.
Figure 3:
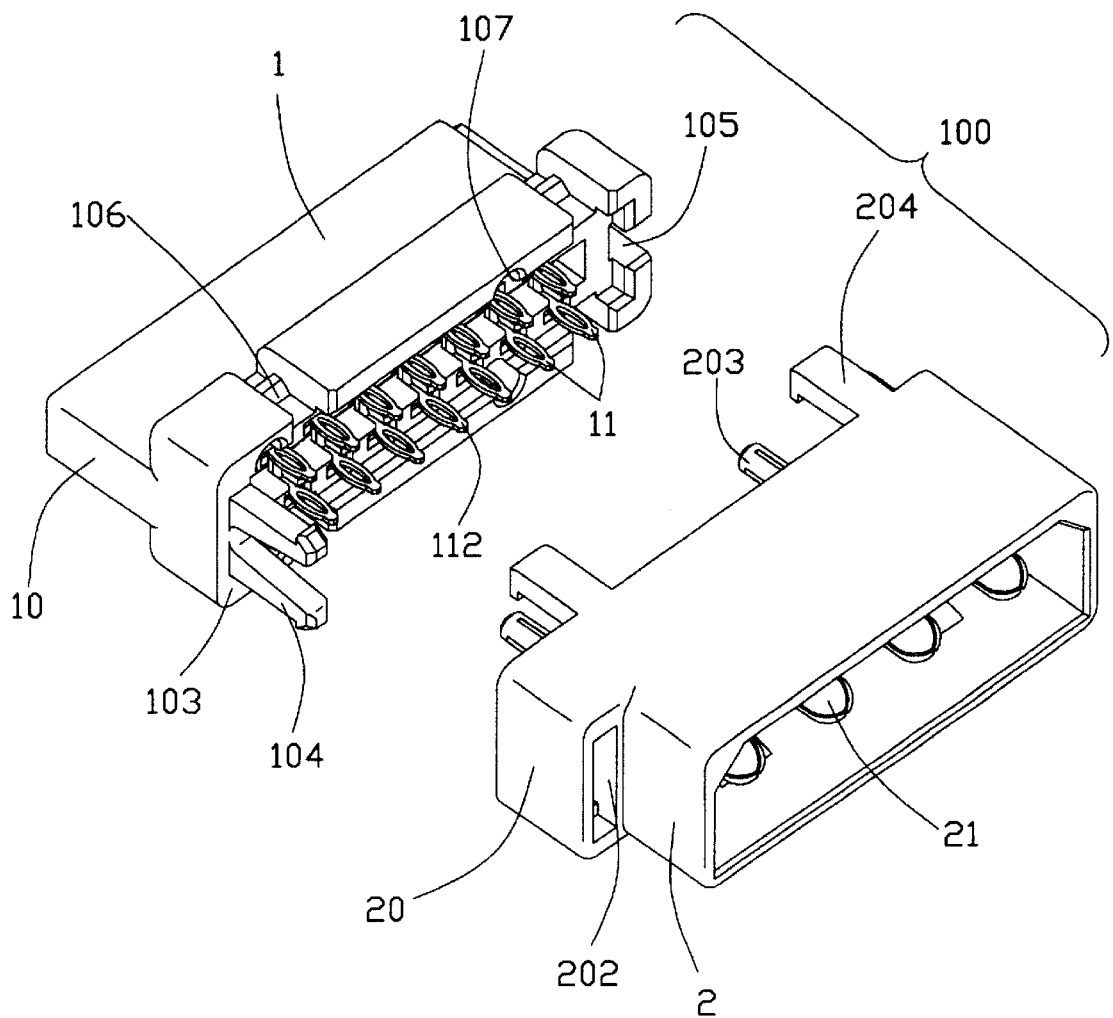
FIG. 3 is an enlarged, partially assembled view of the adapter shown in FIG. 1.
Figure 4:
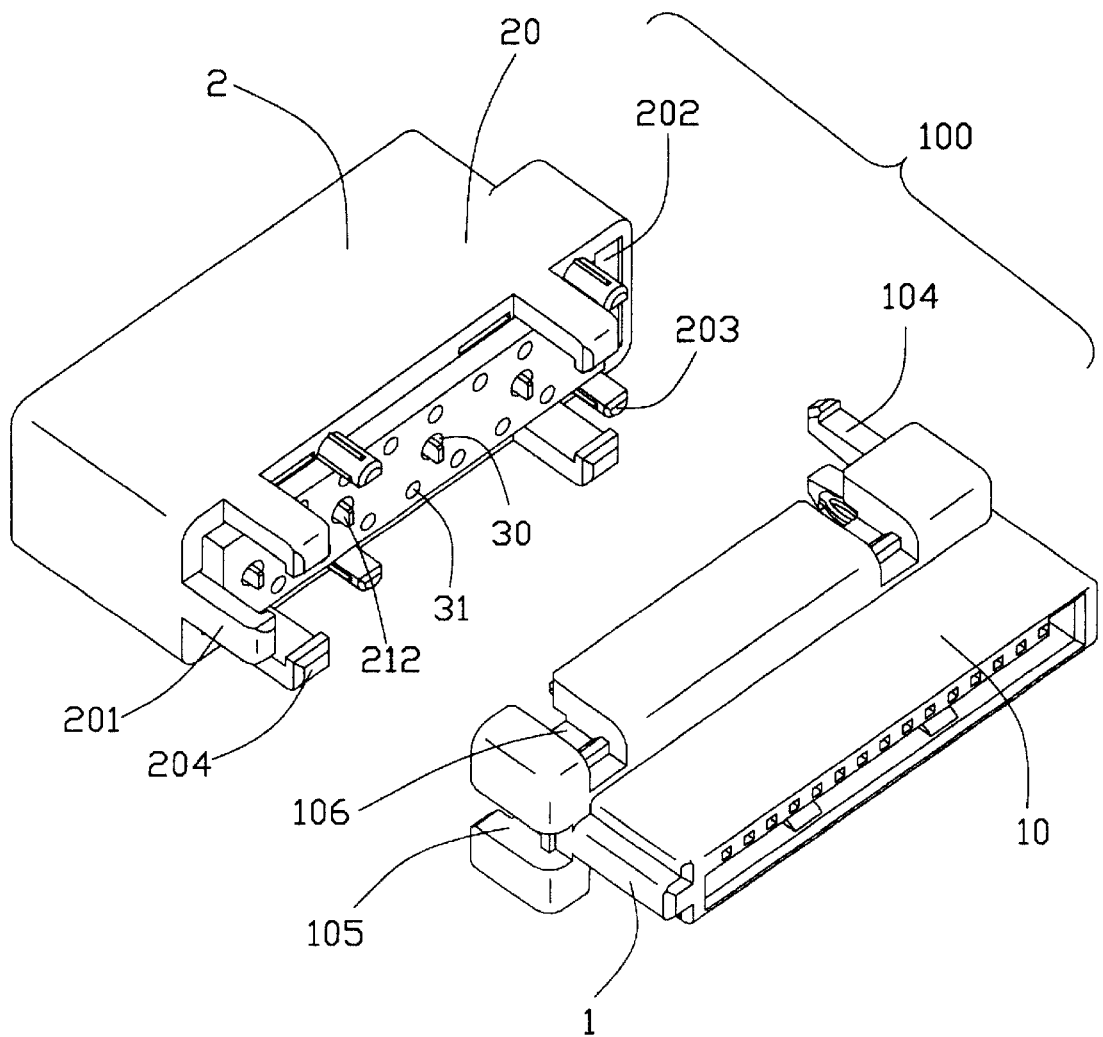
FIG. 4 is an enlarged, partially assembled view of the adapter shown in FIG. 2.
Figure 5:
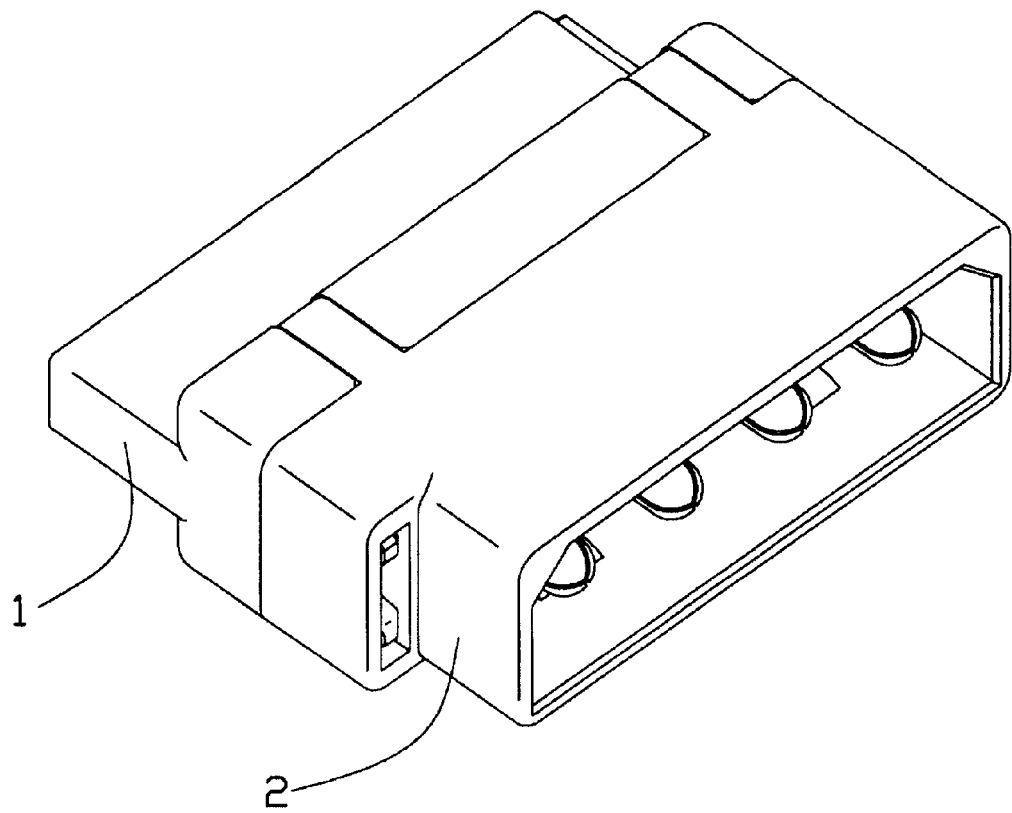
FIG. 5 is an assembled, perspective view of the adapter shown in FIG. 3.
Figure 6:
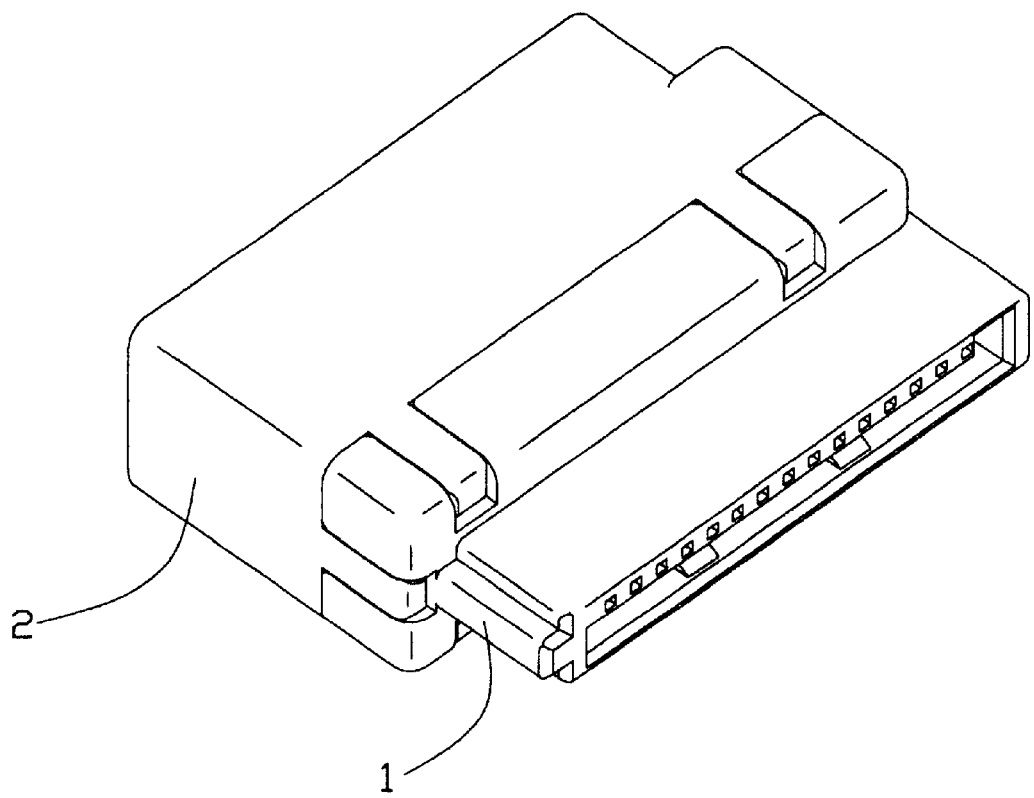
FIG. 6 is an assembled, perspective view of the adapter shown in FIG. 4.

Together referring to FIGS. 1 and 2, an adapter 100 for interconnecting two power connectors in accordance with the present invention, comprises a Serial Advanced Technology Attachment (SATA) connector 1, a conventional power connector 2, and a printed circuit board 3 sandwiched between the SATA connector 1 and the power connector 2.

The SATA connector 1 includes a dielectric first housing 10 having a number of passageways 101 therethrough and a number of terminals 11 received in corresponding passageways 101. Each terminal 11 comprises a contacting portion 110, a press-fit portion 112 and an intermediate portion 114 interconnecting the contacting portion 110 and the press-fit portion 112. The contacting portion 110 is formed at a distal end of the terminal 11 and disposed in a tongue portion 102 (FIG. 2) of the first housing 10, while the press-fit portion 112 is formed at an opposite distal end and disposed on a rear face 103 of the first housing 10. The first housing 10 of the SATA connector 1 includes a board lock 104 formed on a lateral side thereof and a cutout 105 defined on an opposite lateral side. A number of notches 106 are defined on opposite surfaces of the first housing 10, respectively, and a number of cavities 107 are disposed on the rear face 103 adjacent to corresponding notches 106.

The conventional power connector 2 comprises a second housing 20 and four power pins 21 received in the second housing 20. Each power pin 21 includes an engaging portion 210 for engaging with a complementary connector (not shown) and a soldering tail 212 extending rearwardly. The second housing 20 forms a latch 201 (FIG. 2) on a lateral side thereof for being mechanically received in the cutout 105 of the first housing 10, and defines a board lock receiving opening 202 on an opposite side for receiving the board lock 104 of the first housing 10 to thereby securely interlock the first and second housings 10, 20. The second housing 20 also has a number of board locks 204 and guiding posts 203 formed thereon corresponding to the notches 106 and the cavities 107 of the first housing 10 for engaging therewith.

The printed circuit board 3 defines four first through-holes 30 through opposite surfaces thereof for receiving corresponding soldering tails 212 of the power pins 21, and a number of second through-holes 31 for receiving corresponding press-fit portions 112 of the terminals 1. The second through-holes 31 are arranged in two rows with the first through-holes 30 being disposed therebetween. A number of electrical traces (not shown) are arranged on the printed circuit board 3 to thereby conductively connecting the four power pins 21 of the conventional power connector 2 and predetermined terminals 11 of the SATA connector 1 via corresponding first and second through-holes 30, 31.

Referring to FIGS. 1–2 in conjunction with FIGS. 3–6, in assembly, the printed circuit board 3 is firstly attached onto a rear side of the conventional power connector 2 whereby the soldering tails 212 of the power pins 21 are received and soldered in the first through-holes 30 of the printed circuit board 3. The SATA connector 1 is then assembled to the rear side of the conventional power connector 2 and the printed circuit board 3 with the press-fit portions 112 of the terminals 11 being press-fitted in the second through-holes 31 of the printed circuit board 3. Meanwhile, the guiding posts 203, the latch 201 and the board locks 204 of the conventional power connector 2 are received in the cavities 107, the cutout 105 and the notches 106 of the SATA connector 1, respectively. The board lock 104 of the SATA connector 1 is accommodated in the board lock receiving opening 202 of the conventional power connector 2. Consequently, the two connectors 1, 2 are firmly interlocked with the printed circuit board 3 being securely and conductively sandwiched therebetween.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A power adapter comprising:

a printed circuit board defining a first surface and an opposite second surface;

a first electrical connector having a first housing and configured with a Serial Advanced Technology Attachment (SATA) interface thereof and conductively attached on said first surface of said printed circuit board; and a second electrical connector having a second housing and configured as a conventional power connector and conductively attached to the second surface of said printed circuit board;

wherein said printed circuit board defines thereon a number of first and second through-holes arranged in rows, said second through-holes being disposed between said first through-holes;

wherein said first electrical connector includes a number of terminals conductively received in said first through-holes of said printed circuit board, each terminal having a press-fit end fixedly received in corresponding first through-hole;

wherein said second electrical connector includes a number of power pins arranged in row and conductively received in said second through-holes;

wherein said number of terminals have a larger number than said number of power pins;

wherein said first electrical connector includes a board lock formed on a lateral side thereof and a cutout defined on an opposite lateral side, a number of notches are defined on an opposite surface of the first housing, respectively, and a number of cavities are disposed on a rear face adjacent to corresponding notches;

wherein said second housing forms a latch on a lateral side thereof for being mechanically received in the cutout of the first housing, and defines a board lock receiving opening on an opposite side for receiving the board lock of the first housing to securely interlock the first and second housings;

wherein said second housing further have a number of board locks and guiding posts formed thereon corresponding to the notches and the cavities of the first housing engaging therewith.

* * * * *